United States Patent [19]
Poechmueller

[11] Patent Number: 5,859,801
[45] Date of Patent: Jan. 12, 1999

[54] FLEXIBLE FUSE PLACEMENT IN REDUNDANT SEMICONDUCTOR MEMORY

[75] Inventor: Peter Poechmueller, Burlington, Vt.

[73] Assignee: Siemens Aktiengesellschaft, Munich, Germany

[21] Appl. No.: 825,312

[22] Filed: Mar. 28, 1997

[51] Int. Cl.[6] ............................... G11C 7/00; G11C 8/00
[52] U.S. Cl. ...................... 365/200; 365/222; 365/225.7; 365/230.03; 365/230.08; 365/233; 365/240
[58] Field of Search .............................. 365/200, 230.03, 365/230.08, 233, 240, 189.12, 189.05, 222, 225.7

[56] References Cited

U.S. PATENT DOCUMENTS

| | | | |
|---|---|---|---|
| 4,719,601 | 1/1988 | Gray et al. | 365/230.08 X |
| 5,206,831 | 4/1993 | Wakamatsu | 365/230.08 X |
| 5,359,559 | 10/1994 | Nomura et al. | 365/200 |
| 5,383,156 | 1/1995 | Komatsu | 365/200 |
| 5,402,390 | 3/1995 | Ho et al. | 365/225.7 |
| 5,448,528 | 9/1995 | Nagai | 365/233 |
| 5,451,812 | 9/1995 | Gomi | 257/666 |
| 5,506,804 | 4/1996 | Yanagisawa et al. | 365/189.11 |
| 5,532,966 | 7/1996 | Poteet et al. | 365/200 |
| 5,569,955 | 10/1996 | Chillara et al. | 257/666 |
| 5,585,665 | 12/1996 | Anjoh et al. | 257/666 |

*Primary Examiner*—Do Hyun Yoo
*Attorney, Agent, or Firm*—Stanton C. Braden

[57] ABSTRACT

Disclosed is a semiconductor memory having a main memory cell array and redundant memory cells, with a plurality of fuses that can be physically separated from their associated fuse latches. Physical separation is possible by incorporating serial transfer circuitry to serially transfer fuse data from the fuses towards the latches. As a result, only a small number of wires are needed to connect the fuses to the fuse latches, allowing for flexible fuse placement within the memory.

22 Claims, 8 Drawing Sheets

FLEXIBLE FUSE PLACEMENT IN REDUNDANT SEMICONDUCTOR MEMORY

TECHNICAL FIELD

The present invention relates generally to semiconductor memories, and more particularly, to semiconductor memories such as a dynamic random access memory with redundant memory cells and fuses for storing faulty memory cell address data.

BACKGROUND

Due to the increasing density and complexity of contemporary random access memories (RAMs), it is difficult to fabricate RAMs that are completely free of defects within the memory cell array. Accordingly, to increase the yield of these devices, a portion of the memory cell array is designated as a redundant memory section. Memory cells of the redundant memory are accessed whenever it is determined that an incoming address corresponds to a defective portion of the main memory. On-chip logic circuitry is employed to store defective main memory addresses and facilitate writing and reading of data to the redundant memory. This logic circuitry includes multiple fuse groups wherein individual fuses within a fuse group are either open or closed to represent a logic state. Each fuse group thus forms a logic word corresponding to an address of a defective cell or group of cells in the main memory.

Figure 1:
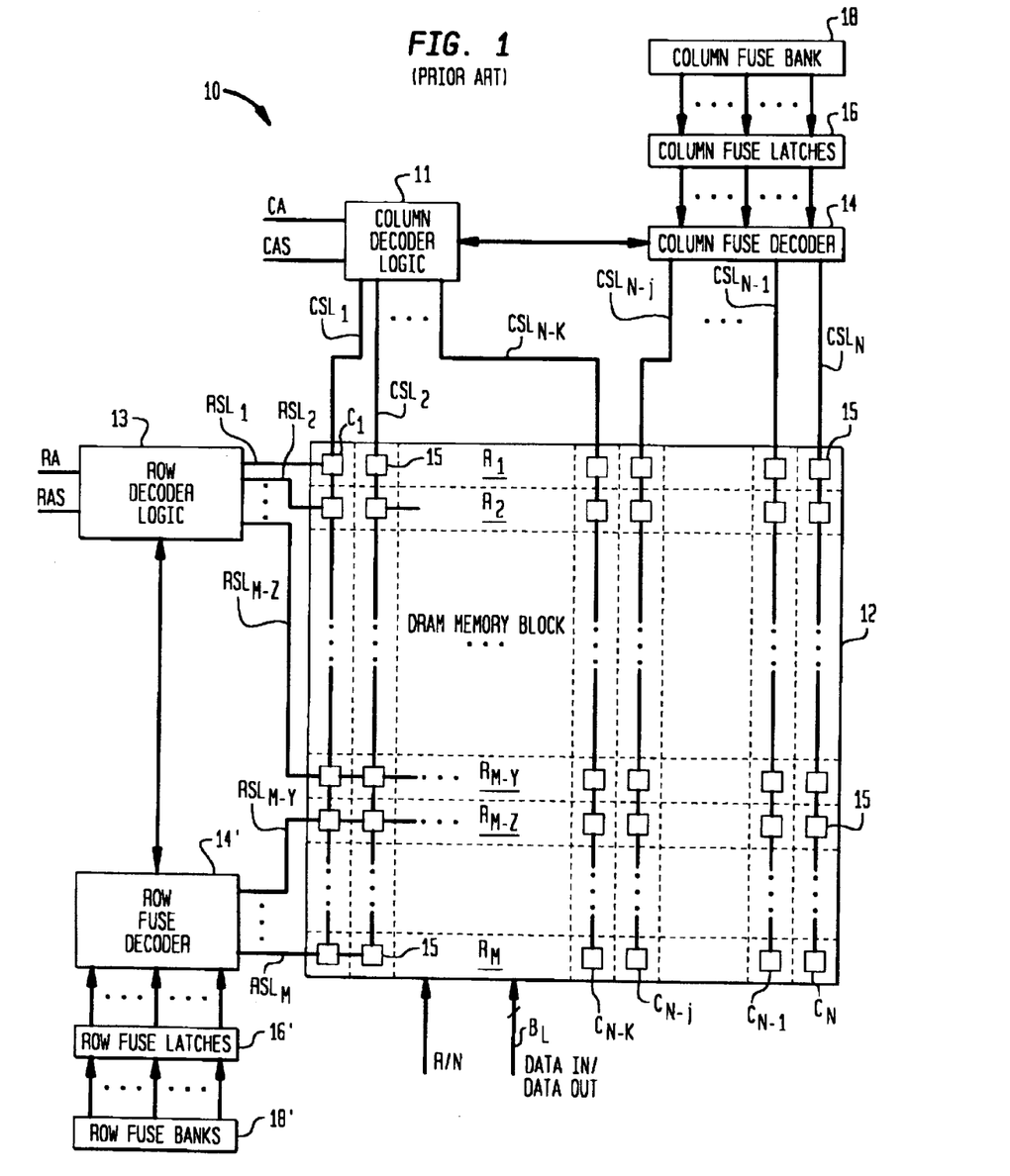
FIG. 1 is a schematic block diagram of prior art DRAM integrated circuitry.

Referring to FIG. 1, a simplified block diagram of a conventional dynamic random access memory (DRAM) integrated circuit 10 is shown. DRAM 10 includes a DRAM memory block 12 having a MxN array of memory cells 15, forming M rows $R_1$–$R_M$ by N columns $C_1$–$C_N$. Although only one memory block 12 and associated circuitry are shown in FIG. 1, there are typically several memory blocks fabricated onto a single DRAM chip. Within each MxN array, K redundant columns, $C_{N-J}$ to $C_N$ (where J=K–1) and Z redundant rows $R_{M-Y}$ to $R_M$ (where Y=Z–1) are designated for redundant memory. Row decoder logic 13 decodes a parallel row address input signal RA to enable one or more of the rows $R_1$ to $R_{M-Z}$ corresponding to the row address. Likewise, one or more columns $C_1$ to $C_{N-K}$ are enabled by column decoder logic 11 in response to a column address input CA. Data is either written to or read from the particular memory cell or cells 15 enabled by both row decoder 13 and column decoder 11. Data flows on bit lines BL connected to each cell, with the direction controlled by read/write signal R/W.

Column and row fuse banks 18 and 18', respectively, include multiple groups of fuses where each fuse group stores a column or row address corresponding to a defective column or row. Each fuse is a laser fusible link which is typically composed of polysilicon or metal and covered by a uniform layer of dielectric, such as silicon dioxide. After DRAM fabrication, tests are performed on the memory array to determine which rows and/or columns contain defective cells. The corresponding addresses are then written into the fuse groups by laser destruction of selective fuse links to create electrical opens. Each fuse group may contain about ten fuses to store a column or row address.

When the DRAM chip is powered up, the fuse information in the column and row fuse banks is written as parallel data into respective column and row fuse latches 16 and 16'. The fuse latches are read during the course of chip operation by associated column and row fuse decoders 14, 14'. Incoming column addresses CA to column decoder logic 11 are dynamically provided to column fuse decoder 14 which compares the address to those stored in the fuse latches 16. If there is a match, the column decoder logic 11 will not enable the column select line $CSL_i$ corresponding to the address. Instead, the column fuse decoder 14 will enable a specific one of column select lines $CSL_{N-J}$ to $CSL_N$ to activate a redundant column for data storage. Row fuse decoder 14' operates in conjunction with row decoder logic 13 in analogous fashion to enable any of redundant row select lines $RSL_{M-Y}$ to $RSL_M$.

Figure 2:
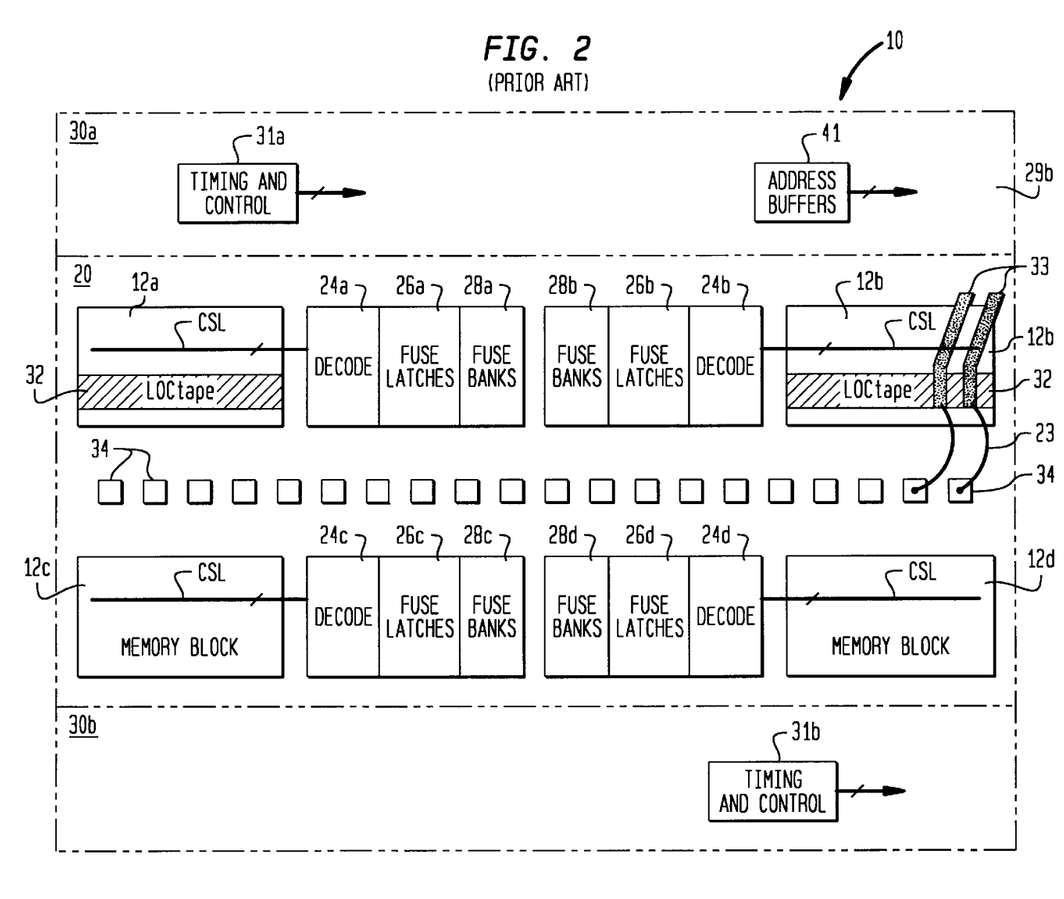
FIG. 2 illustrates a prior art DRAM layout.

FIG. 2 illustrates an exemplary architecture of a prior art DRAM chip such as a 64M chip. Four 16M memory blocks 12a–12d are disposed in a region 20, with respective decoders/fuse decoders 24a–24d adjacent the respective memory blocks in a central area therebetween. Each of decoders/fuse decoders 24a–24d (hereafter, decoders 24a–24d) includes column decoder logic 11 with associated column fuse decoder 14, and/or row decoder logic 13 and associated row fuse decoder 14' discussed above. Fuse latches 26a–26d and fuse banks 28a–28d are adjacent respective decoders 24a–24d. A typical DRAM contains thousands of fuses, with each fuse connected to an associated fuse latch. As such, the fuse banks are placed close to the fuse latches and fuse decoding logic to minimize the necessary wiring. Other circuitry such as timing and control logic 31a, 31b and address buffers 41 are situated, e.g., in regions 30a and 30b away from the memory blocks.

A type of packaging technology often used for DRAM chips is known as leadframe on chip (LOC) technology, in which a leadframe is bonded to the chip surface by means of an LOC "tape". The leadframe supports connection of conductive leads or terminals to the internal electronics of the chip. The LOC tape serves as a physical connection between chip and leadframe as well as a "soft buffer" when a bondwire is connected to the tip of a lead. Bonding is only permitted on lead areas supported by the tape.

As shown in FIG. 2, LOC tape 32 runs across DRAM 10, overlaying two of the memory blocks 12a, 12b. A row of electrical contact pads 34 are disposed between top and bottom halves of the layout. Bondwires 23 electrically connect contact pads 34 to leads 33. The circuit connections to contact pads 34 include the address input lines, the R/W line, and so forth. The placement of LOC tape 32 is restricted by the fuse banks 28a–28d for reliability reasons. The LOC tape attracts moisture and therefore would be a concern for the unprotected fuse region if the tape were to run too close to the fuses. Consequently, LOC tape 32 needs to be cut to avoid running over the fuse banks. Typical tape design rules require a tape break of at least one millimeter. This reduction in overall tape length results in the lead pitch becoming smaller. A reduced lead pitch is problematic for memories in which a large number of leads need to be accommodated on a small die size, such as a 64M DRAM design based on 0.25 um technology. For instance, with chip lengths on the order of 10 mm, a 1 mm tape break tightens the lead pitch by about 10%.

As an alternative to cutting the LOC tape, the fuses could hypothetically be moved to another area of the chip, such as region 30a or 30b. Moving the fuses to one of regions 30a, 30b or elsewhere on the chip would require a large number of connecting wires to connect the fuses to the fuse latches to implement parallel fuse blow data transfer. Alternatively, the fuses could principally be moved together with the fuse latches and decode logic; however, this would also result in a prohibitively large number of connecting wires or in speed penalties. Therefore, prior art architectures place fuses close to the associated latches and decode logic and there is only a limited flexibility in moving the fuses.

Accordingly, there is a need for a memory architecture which avoids the necessity of cutting the LOC tape along with the associated reduction in lead pitch, and which does not employ an overly-complex wiring arrangement.

SUMMARY OF THE INVENTION

The present invention relates to a semiconductor memory having a main memory cell array and redundant memory cells, with a plurality of fuses that can be physically separated from their associated fuse latches. Physical separation is possible by incorporating serial transfer circuitry to serially transfer fuse data from the fuses towards the latches. As a result, only a small number of wires are needed to connect the fuses to the fuse latches, allowing for flexible fuse placement within the memory.

In an illustrative embodiment, the fuses are arranged in fuse groups for storing address information, with each fuse being in either an open or closed state corresponding to a bit of an address of at least one faulty cell within the main memory cell array. The fuse latches store the address information received from the fuses during operation of the semiconductor memory to facilitate storage of data in the redundant memory cells as a substitute for faulty cells in the main memory. The serial transfer circuitry serially transfers at least some of the address information from the fuses towards said latches. Thus, a small number of bus lines may be employed to simultaneously transfer fuse data from a corresponding small number of fuses in a sequential manner. Advantageously, sequential reading of fuse data does not result in a large power surge as is the case in prior art memories where the all fuse data are transferred simultaneously in parallel.

The serial transfer circuitry may include a first shift register adjacent the fuse banks, a second shift register adjacent the fuse latches, and timing and control logic coupled to each shift register to synchronize the transfer of fuse data into corresponding latches. With this configuration, fuse latch refreshing can be implemented with low power consumption. The shift registers may be modified as ring shift registers for this purpose.

The semiconductor memory may be a DRAM using leadframe on chip (LOC) packaging. Advantageously, since the fuse banks can be moved away from the main memory cell array, the LOC tape may extend continuously across the memory without having to be cut. As a result, lead pitch may be increased over prior art designs.

BRIEF DESCRIPTION OF THE DRAWINGS

Preferred embodiments of the present invention are described herein with reference to the drawings, in which like reference numerals identify similar or identical components throughout the several figures, wherein.

DETAILED DESCRIPTION OF THE PREFERRED EMBODIMENTS

The invention relates to memory devices having redundant memory cells. The invention provides for increased flexibility in the placement of fuses that are used to store addresses of defective memory cells within the memory array. Such increased flexibility, as previously described, facilitates the design and manufacturing of high density memory devices. For purposes of discussion, the invention is described in the context of a DRAM chip. The invention however has broader applications. Merely by way of example, the invention has application in other memory devices that utilize fuses or other bit storage element to store faulty memory cell addresses such as EDO-DRAM, SDRAM, RAMBUS-DRAM, SLDRAM, MDRAM, or SRAM.

Figure 3:
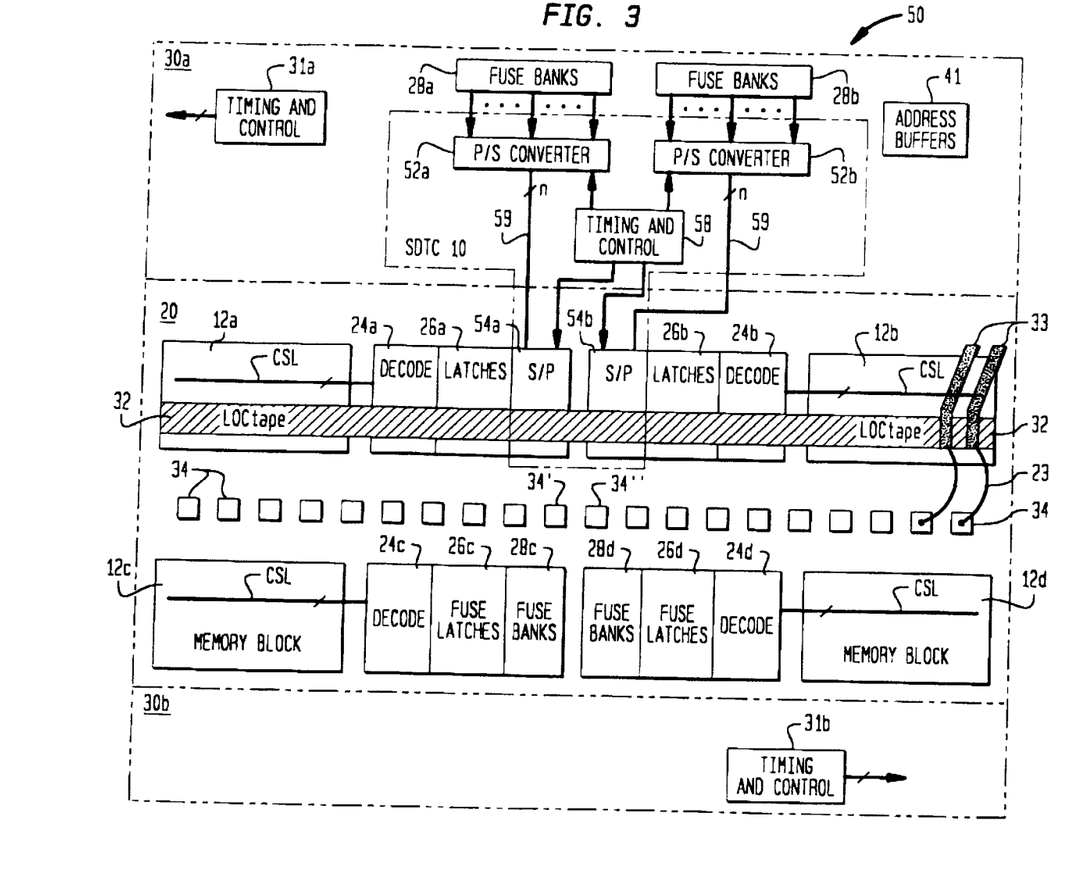
FIG. 3 shows a memory architecture in accordance with the present invention.

Referring to FIG. 3, an exemplary architecture of a semiconductor memory 50 in accordance with the present invention is schematically illustrated. As shown, memory 50 for example is a DRAM. Memory 50 is an improvement over memory 10 described above, in that at least some of the fuse banks have been moved out of the central region of the chip between the memory blocks 12a–12d. Fuse banks 28a, 28b have been moved to an area within region 30a, which may be an unused silicon area. As a result, the LOC tape 32 is permitted to extend continuously across the chip, thereby enabling the lead pitch to be increased. An increase in lead pitch is possible because leads 33 may now be connected to the central portion of the LOC tape for wire bonding connection to the centralized contact pads such as 34' and 34". In addition, memory 50 employs serial data transfer between the fuse banks and their respective fuse latches, thereby minimizing the wiring between the fuses and fuse latches.

In the shown embodiment, the lower fuse banks 28c, 28d remain in their previous locations adjacent the respective fuse latches 26c, 26d. Optionally, these fuse banks could be moved away from the fuse latches as well. In general, the present invention allows for a high degree of flexibility in the fuse placement, thus permitting flexibility in the layout of the other circuitry on the chip.

The physical separation of fuse banks 28a, 28b from their associated fuse latches 26a, 26b is accomplished by employing serial data transfer circuitry (SDTC) 10. In one embodiment, the SDTC comprises parallel to serial (P/S) converters 52a, 52b, serial to parallel (S/P) converters 54a, 54b and associated timing and control logic 58 on the chip. (As used herein, the phrase "parallel to serial" implies a transfer of data that originates on parallel lines, as serial data on a reduced number of lines. Likewise, the term "serial to parallel" implies a transfer of serial data on one or more lines as parallel data on a larger number of lines). Serial to parallel converters 54a, 54b are located adjacent respective fuse latches 26a, 26b in the space previously occupied by the fuse banks. Addresses corresponding to defective memory cell locations are stored within the fuse banks, with each fuse storing one bit of an address. For example, the fuses may be arranged in fuse groups of about ten fuses to store ten bit column or row addresses. During power up of the chip, the fuse data is transferred on parallel lines to parallel to serial converters 52a and 52b. Preferably, this transfer is performed sequentially as will be discussed below.

A bus 59 comprising n number of bus lines connects each P/S converter with its respective S/P converter. Bus 59 transfers data from the P/S converter serially to the S/P converter. The S/P converter then transfers the data on parallel lines to the adjacent fuse latches for storage. Each sequential transfer comprises information from n number of fuses. As such, the lower the number n is, the greater the number of transfers required to transfer information from all the fuses to the latches. For example, the extreme case of where n equals to one, each serial transfer comprises information from a single fuse. Although a higher number improves performance by decreasing the transfer time required to store information from all fuses into the latches, this is achieved at the expense of additional wiring. Therefore, there is a tradeoff of speed vs. wiring complexity in the choice of the number of serial bit lines 59.

Theoretically, n can be chosen to be $1 \leq n \leq G$ where G equals the number of fuses in the fuse bank. However to improve efficiency of transfer, n should be chosen such that G is a multiple thereof. Additionally, the upper limit of n should be G/2. In one embodiment, n is chosen to be $1 \leq n \leq G/2$.

Conventionally, fuse data is transferred during the power up process of the memory chip. Since the power up process is typically slow, n can be kept reasonably low to reduce the wiring and the chip area it consumes. Preferably, n is selected in the range of four to ten bus lines. This number of bus lines is generally sufficient to serially transfer the address data stored in thousands of fuses of a typical 64M DRAM or the like during the time consumed for conventional power up.

Another advantage of utilizing serial data transfer between the fuses and fuse latches of memory 50 is a reduction of power surges during the fuse read operation. In the prior art, the fuse latches are typically switched simultaneously to transfer the fuse data thereto, thus creating a power surge. The serial transfer technique avoids such power surges since only a small number of latches are activated at any given time.

Other aspects of memory 50 may be the same or similar to that described above in reference to memory 10 of FIGS. 1 and 2. For example, decoders 24a–24d operate to compare incoming addresses with the addresses stored in corresponding fuse latches 26a–26d. When the address matches that of a faulty column or row, the respective decoder 24a–24d activates redundant rows or columns in the associated memory block 12a–12d (or portions of rows or columns therein) via appropriate voltages on column select lines or row select lines.

Figure 4A:
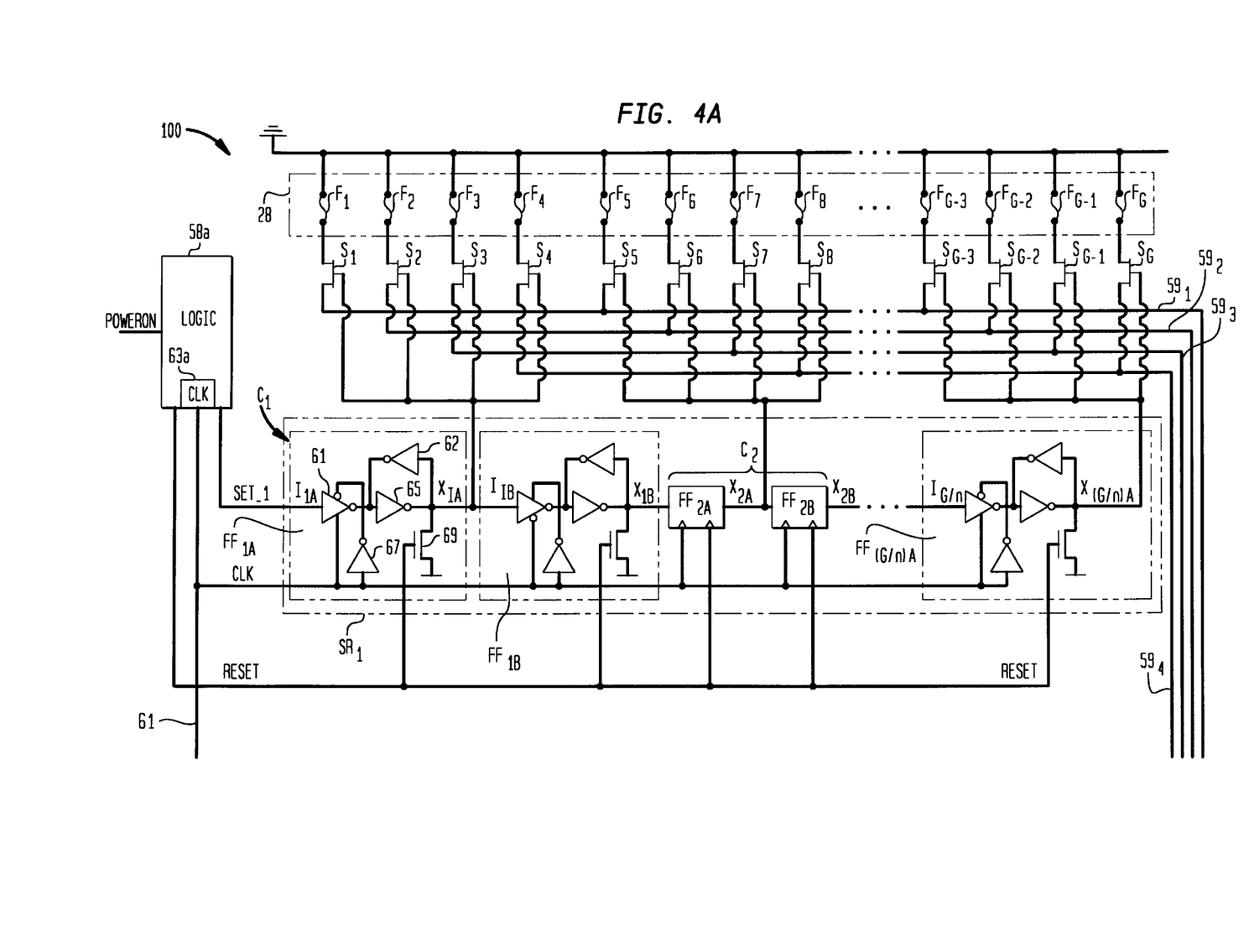
FIG. 4 is a schematic diagram of exemplary serial data transfer circuitry to transfer fuse data to fuse latches.
Figure 4B:
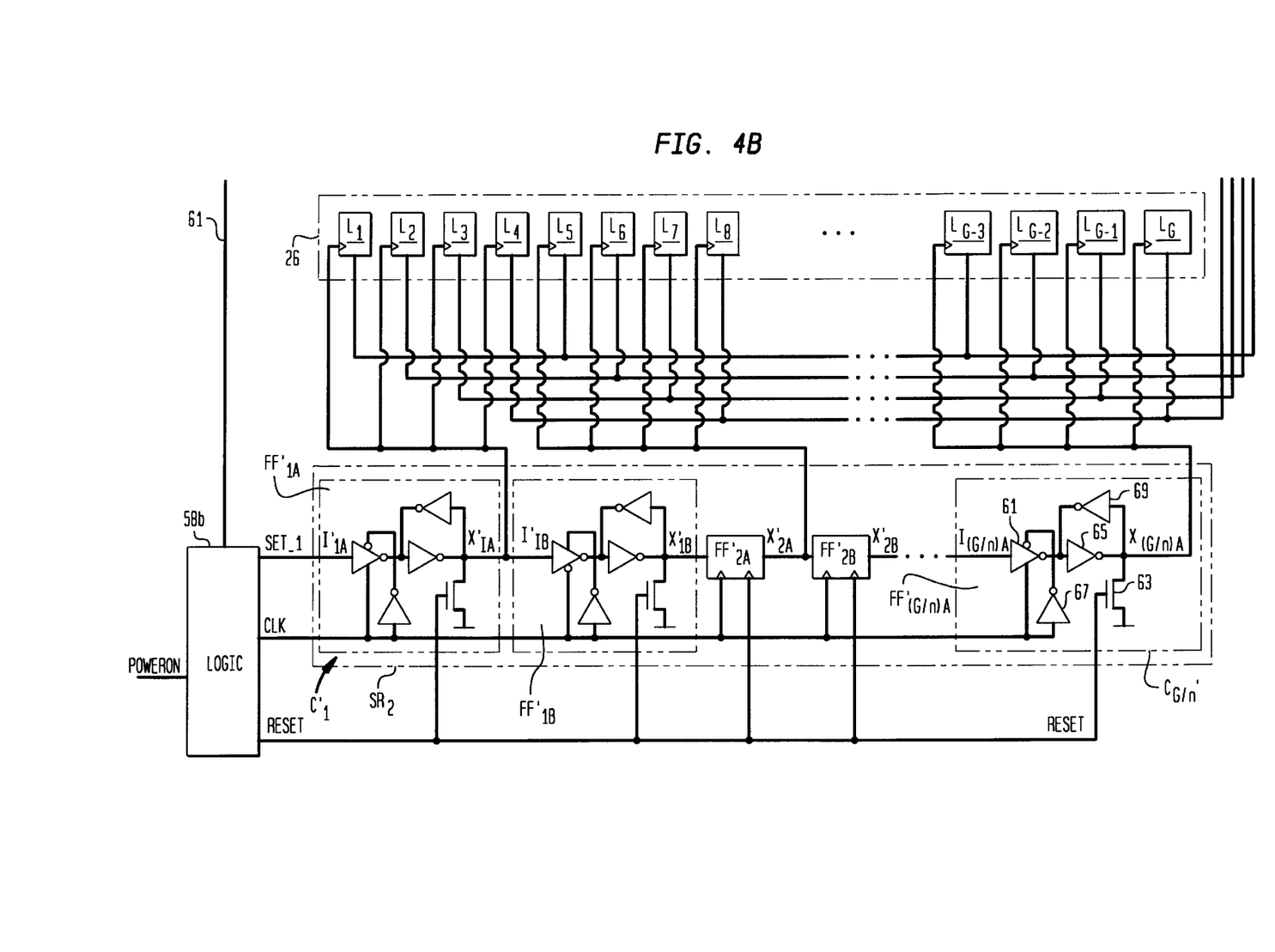

FIG. 4 is a schematic diagram of an exemplary SDTC 10. The SDTC is implemented to serially transfer fuse data from a fuse bank 28 to a fuse latch bank 26. Illustratively, the fuse bank comprises G number of fuses $F_1$ to $F_G$. The fuse latch bank also comprises G number of latches $L_1$ to $L_G$ corresponding to fuses $F_1$ to $F_G$. The SDTC transfers information from a fuse $F_1$ to a corresponding latch $L_i$, where i is from 1 to G. A data bus 59 comprising n number of bus lines enables a serial transfer of information from n number of fuses to n number of corresponding latches. As such, a complete transfer of all fuse information to the fuse latches would require G/n transfers.

A shift register $SR_1$ and a set of switches, $S_1$ to $S_G$, operate together to carry out a parallel to serial conversion function. Each switch $S_i$ is coupled to a corresponding fuse $F_i$, where i is from 1 to G. The switches, for example, are FETs. Timing and control logic (TCLs) 58a and 58b control the shift registers SR1 and SR2, respectively. As shown, the TCLs receive as an input a poweron signal and produces outputs set __1, reset, and clock (CLK). The CLK, for example, may be tied to the system clock or a separate clock that generates CLK pulses. Illustratively, TCL 58b is synchronized with TCL 58a by receiving the CLK signal from TCL 58a. The shift register $SR_1$ responds to the outputs of the TCL 58a to initiate serial transfer of fuse information to the latches.

The shift register comprises, for example, G/n bits corresponding to the number of transfers needed to store all fuse information into the fuse latches. Each bit of the shift register $SR_1$ is coupled to a group of n switches. The switches within any group are not connected to other bits of the shift register $SR_1$. Additionally, the switches within the group connect their respective fuses to a unique one of the n bus lines. When TCL initiates a serial transfer of fuse information from the fuse bank to the fuse latch bank, shift register $SR_1$ activates a unique group of switches with each clock cycle, causing information from the associated fuses to be transferred onto the bus.

A shift register $SR_2$ operates in conjunction with latch bank 26 to implement a serial to parallel conversion function. Shift register $SR_2$, in one embodiment, is identical to $SR_1$. Shift register $SR_2$ responds to outputs of the TCL 58b. As shown, separate TCLs are used to control shift registers $SR_1$ and $SR_2$. Alternatively, a common TCL may be used to control both shift register. Each bit of the shift register $SR_2$ activates a group of n latches to store information from the data bus. The latches within any group are not connected to other bits of the shift register $SR_2$. Additionally, the latches within the group store information from a unique one of the n bus lines. When TCL initiates serial transfer of fuse information from the fuse bank to the fuse latch bank, shift register $SR_2$ activates a unique group of latches with each clock cycle, causing information from the associated fuses that are on the bus to be stored in the latches.

A bit of the shift register corresponds to a register cell. As shown, the shift register $SR_1$ and $SR_2$ comprise G/n shift register cells, $C_1$–$C_{G/n}$ and $C_1'$–$C_{G/n}'$, respectively. In one embodiment, each shift register cell $C_1$ or $C_1'$ (with the exception of the last cells $C_{G/n}$ and $C_{G/n}'$) comprises two flip flops, $FF_{iA}$ and $FF_{iB}$ or $FF_{iA}'$ and $FF_{iB}'$, respectively. The X outputs of the "A" flip flops of the cells correspond to the bits of the shift register. As such, the X outputs are each connected to a group of n unique fuses. Each of the X' outputs of the "A'" flip flops is connected to the "latch set" inputs of a corresponding group of n latches. The X, X' outputs of the A, A' and B, B' flip flops are connected to the I, I' inputs of the next higher B, B' and A, A' flip flops, respectively. As described, the shift registers are shift right registers. That is, with each clock cycle, the data stored therein are shifted one bit to the right. However, other shift registers are also useful. Merely by way of example, shift left registers or a combination of shift right and shift left registers are also useful, as long as the SDTC is configured such that information from each fuse is transferred to its corresponding latch. In the example of FIG. 4, n=4. As such, data of four fuses at a time are transferred simultaneously on bus lines $59_1$ to $59_4$ to four corresponding latches within latch bank 26.

Figure 5:
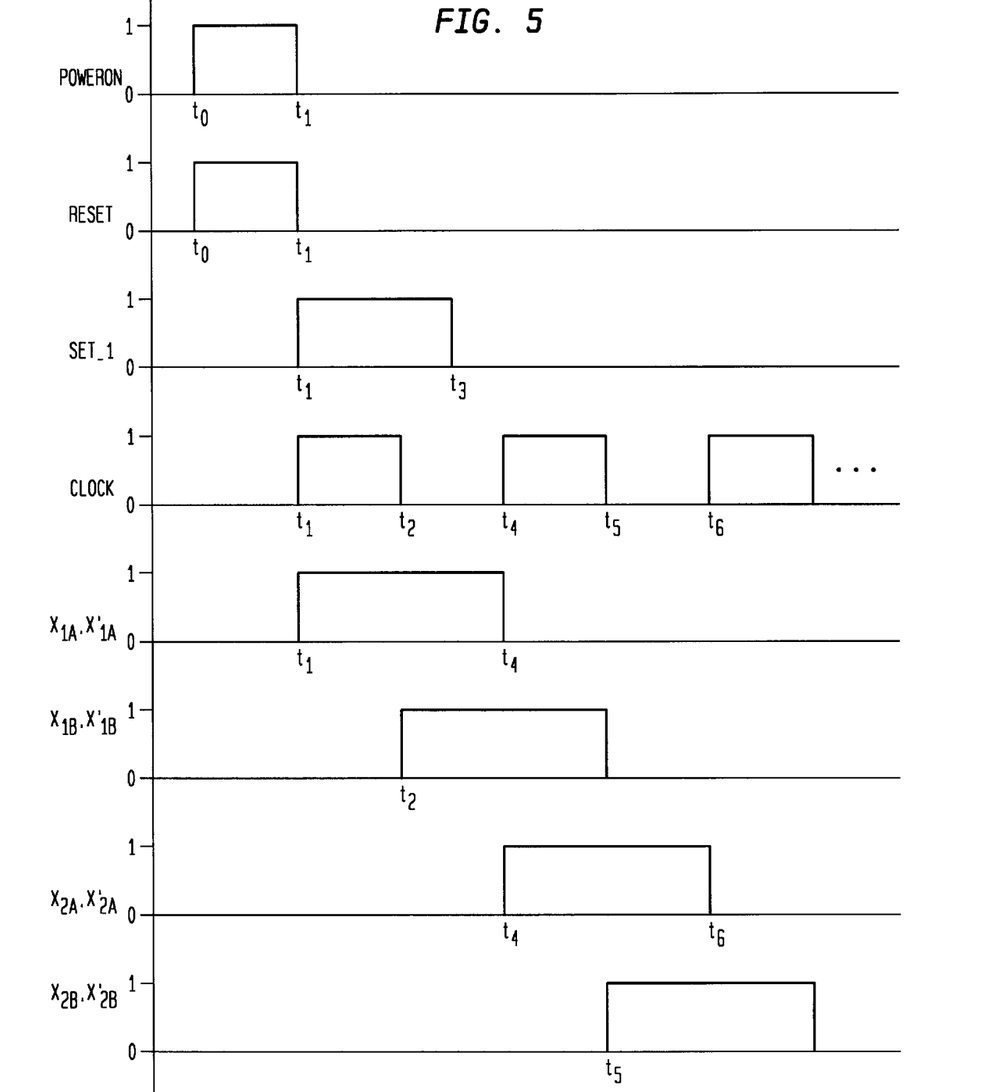
FIG. 5 is a timing diagram illustrating various timing signals flowing in the circuit of FIG. 4.

Operation of the circuitry of FIG. 4 will now be discussed with reference to the timing diagram of FIG. 5. In operation, when the memory is first powered up at time $t=t_0$, a "poweron" pulse is applied to the TCL 58. In response, TCL generates a reset signal to reset all the flip flops within shift registers $SR_1$ and $SR_2$ to have logic zero outputs. Next, at time $t_1$, a clock 63 within TCL 58 begins generating clock pulses which are applied to each of the flip flops within shift registers $SR_1$ and $SR_2$ to implement the data shifting function. In synchronism with, for example, the leading edge of the first clock pulse, a Set_1 pulse is generated. Illustratively, the Set_1 pulse is an active high (logic one) pulse. The use of a active low (logic zero) pulse is also useful. In one embodiment, the width of the Set_1 pulse is slightly longer than the clock pulse width. The length of the set_1 pulse is sufficiently longer than the clock pulse to ensure that the set is locked in the shift registers. For example, if the set_1 pulse goes low (inactive) before the clock pulse does, the set pulse in the shift registers would be lost. The set_1 pulse is deactivated prior to the next clock pulse. Set_1 is applied to both data input ports $I_{1A}$ and $I_{1A}'$ of the respective outermost flip flops $FF_{1A}$ and $FF_{1A}'$. Concomitantly, the logic one of the Set_1 pulse is transferred to $X_{iA}$, $X_{iA}'$ at time $t_1$. At the trailing edge of the first clock pulse (time $t_2$), the logic one is transferred to the output ports $X_{1B}$, $X_{1B}'$ of respective flip flops $FF_{1B}$, $FF_{1B}'$. Set_1 then falls to logic zero at time $t_3$ before the onset of the next clock pulse and remains at logic zero for the remainder of the data shifting operation.

The output line $X_{1A}$ of $FF_{1A}$ is connected to the gates of FETs $S_1$ to $S_n$ (where $S_n=S_4$ in the present example). As such, when the logic one of the Set_1 pulse is transferred to $X_{1A}$, $X_{1A}'$ at time $t_1$, FETs $S_1-S_4$ are switched ON. Meanwhile, since the other flip flops $FF_{2A}-FF_{(G/4)A}$ were previously reset, their outputs are all zero, such that the other switches $S_5-S_G$ are all OFF. Thus, between time $t_1$ and the leading edge of the next clock pulse (time $t_4$) only the fuse data of fuses $F_1-F_4$ are transferred to bus lines $59_1-59_4$, respectively. When any given fuse $F_i$ is intact, a logic zero is transferred to the associated line $59_i$ since all the fuses are connected on one side to ground potential. When any fuse $F_i$ is blown, a high impedance is provided to the bus line, which is detected by the associated latch circuit $L_i$ as indicative of a logic high. For example, this state can be detected if the bus lines are pre-charged to five volts (because this voltage is not discharged) or if a weak bleeder circuit is available on the chip. Alternatively, the fuses may be connected to voltage source and the bus lines connected to ground. In this instance, a blown fuse would result in a logic zero being transferred and an intact fuse would result in a logic one being transferred.

During the time interval that switches $S_1-S_4$ are closed, i.e., between $t_1$ and $t_4$, the logic high at output port $X_{1A}'$ is provided to the latch set inputs of latches $L_1-L_4$. The logic high at the latch set inputs activates the latches, thereby enabling the fuse data on lines $59_1-59_4$ to be simultaneously transferred to latches $L_1-L_4$, respectively.

At the trailing edge of the first clock pulse, flip flops $FF_{1B}$, $FF_{1B}'$ transfer the logic high of the Set_1 pulse to the respective inputs $I_{2A}$, $I_{2A}'$ of the next flip flops $FF_{2A}$, $FF_2A'$ in the series. At the leading edge of the second clock pulse (time $t_4$), the logic high at $I_{2A}$, $I_{2A}'$ is transferred to outputs $X_{2A}$, $X_{2A}'$, while the logic zero present at $I_{1A}$, $I_{1A}'$ is transferred to $X_{1A}$, $X_{1A}'$. This opens switches $S_1-S_4$ and disables latches $L_1-L_4$ while closing switches $S_5-S_8$ and enabling latches $L_5-L_8$ (which have their latch set inputs connected to outputs $X_{2A}$ and $X_{2A}'$, respectively). As such, only the fuse data of fuses $F_5-F_8$ are transferred to respective fuse latches $L_5-L_8$ between time $t_4$ and time $t_6$ (the latter corresponding to the leading edge of the third clock pulse). The sequential fuse read and transfer continues until the data of the last set of fuses $F_{G-3}$ to $F_G$ is transferred to corresponding latches $L_{G-3}$ to $L_G$. (It is noted that in the embodiment of FIG. 4, the least shift register cell $C_{G/n}$ only includes one flip flop, $FF_{(G/n)A}$. The last fuse read occurs when the Set_1 pulse logic high is transferred to the output $X_{(G/n)A}$ of the last flip flop).

As shown in FIG. 4, each flip flop $FF_i$ within shift registers $SR_1$ and $SR_2$ may include a tri-state buffer inverter 61 having its input as the flip flop data input port such as $I_{1A}$. The clock signal is applied to an inverter 67 which has its output connected to the enable port of buffer 61. Each buffer 61a of the A flip flops is enabled on the rising edges of the clock pulses while each buffer 61b of the B flip flops is enabled on the negative clock pulse edges. Another inverter 65 is in series with inverter 61. The inverter 65 output is the output $X_i$ of the flip flop. A feedback inverter 63 is connected across inverter 65. The reset signal is applied to the gate of a FET switch 69. When reset is high, FET 69 is ON, which drives the output $X_i$ low, thereby resetting the flip flop. In any event, other configurations for the shift register flip flops known to those skilled in the art may alternatively be employed.

Advantageously, the circuit configuration of FIG. 4 requires only a minimum of n+1 wires to be routed to the associated fuse latch region—the n data wires of bus lines 59 and the clock wire 61 for synchronization. This realization is highly efficient and requires only a minimum area penalty. As such, there is a high degree of flexibility in fuse placement. Moreover, the shift register layout can be implemented with two metal layers such that the data bus and reset signal can be routed over the register area in a third metal layer. With the number n of bus lines reasonably small (e.g., in the range of four to six) the layout will essentially be dominated by the metal pitch of the read data bus 59.

As mentioned above, a large number of fuses are involved in conventional DRAM design. As a result, such memories which reads all fuses in parallel causes a large power surge. However, reading fuse data in accordance with the invention distributes power consumption over a relatively long time period, thus avoiding a large power surge.

Another serious concern with conventional DRAMs is fuse data reliability. Power on detection is very difficult and a detection may accidentally happen despite the internal power supply being too low. This could result in invalid fuse data being provided to the fuse decoders. Further, supply voltage bumps (variations) during chip operation can corrupt fuse latch data.

Figure 6A:
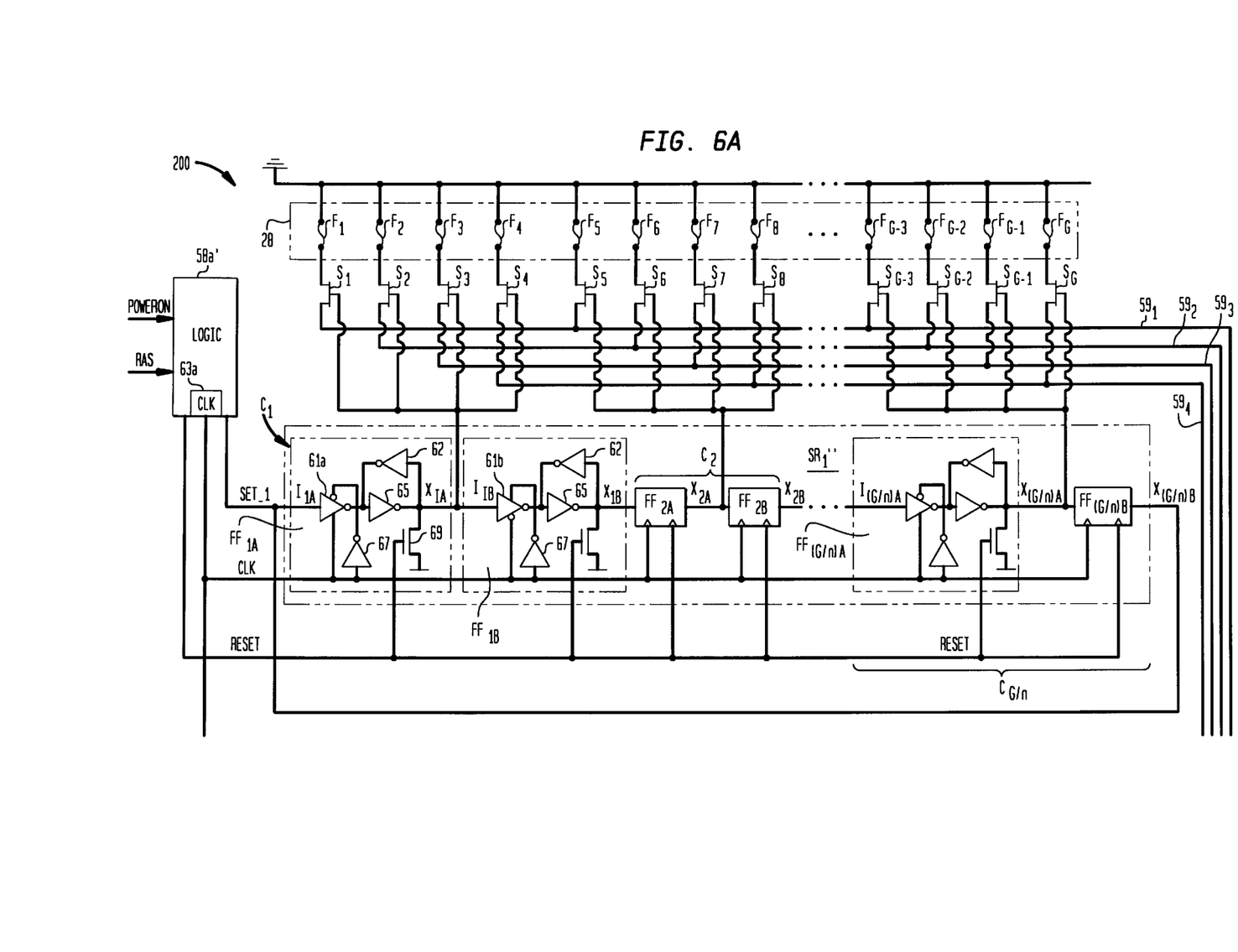
FIG. 6 schematically illustrates modified serial data transfer circuitry to permit fuse latch refreshing.
Figure 6B:
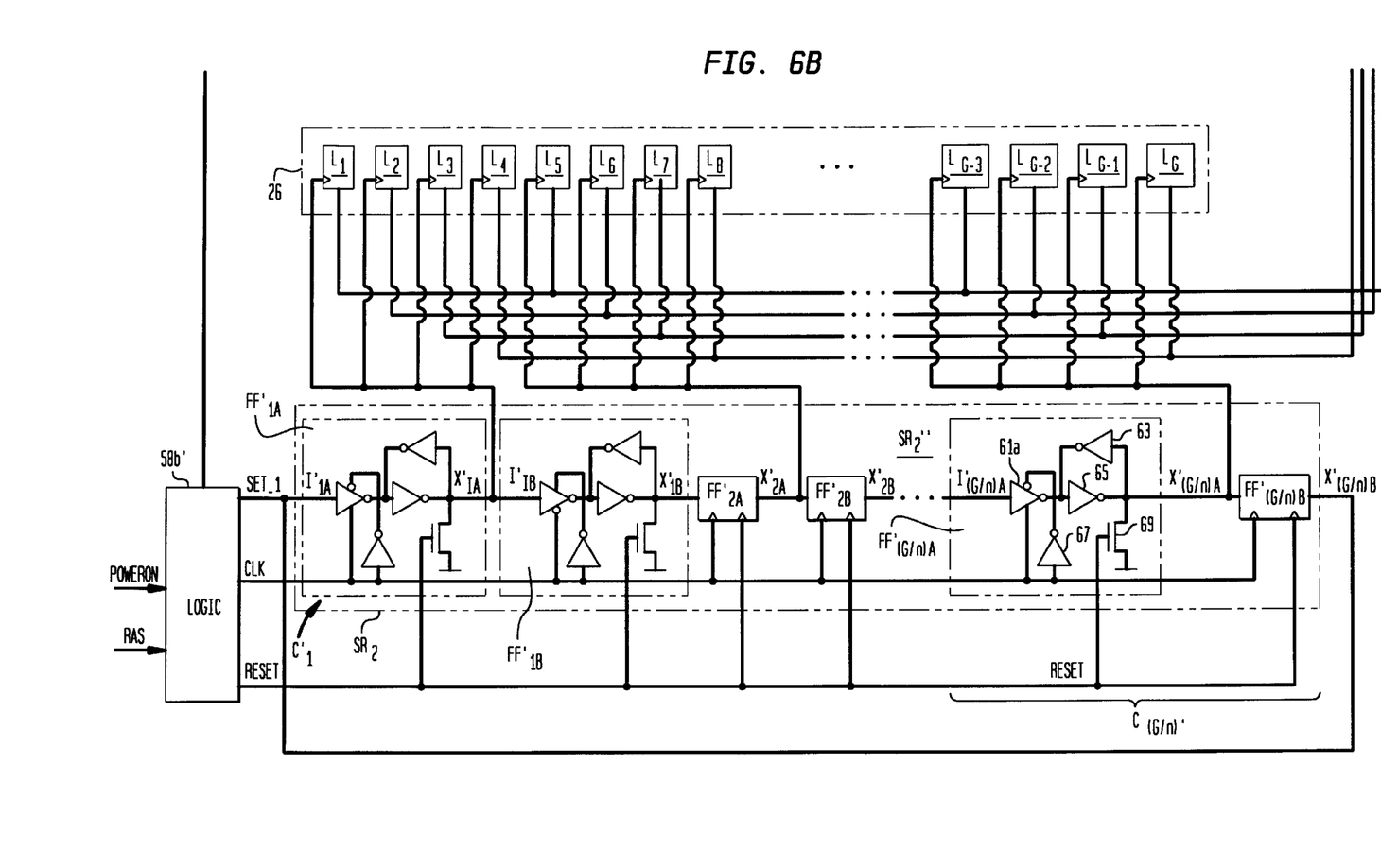

With reference now to FIG. 6, serial data transfer circuitry 200 is designed to alleviate the above-noted problems of fuse data reliability. Circuitry 200 is a modified version of the circuitry 100 of FIG. 4. Shift registers $SR_1$, $SR_2$ have been modified into ring shift registers $SR_1''$, $SR_2''$, respectively, by adding flip flops $FF_{(G/n)B}$ and $FF_{(G/n)B}'$ to the last shift register cells $C_{G/n}$ and $C_{G/n}'$, respectively, and feeding back outputs $X_{(G/n)B}$ and $X_{(G/n)B}'$ to the respective input ports $I_{1A}$ and $I_{1A}'$ of the first flip flops. This modification enables continuous updating of the fuse latches. Once the logic one of the Set_1 pulse reaches the last outputs $X_{(G/n)B}$ and $X_{(G/n)B}'$, the logic one that is fed back to ports $I_{1A}$ and $I_{1A}'$ operates essentially as a new Set_1 pulse, and the data of fuses $F_1-F_G$ is sequentially transferred into corresponding latches $L_1-L_G$ once again. Accordingly, with the use of ring shift registers, the fuse latches can be updated continuously as long as the clock signals continue to be generated. Alternatively, the clock signals can be selectively suspended to realize discontinuous updating of the fuse latches.

Figure 7:
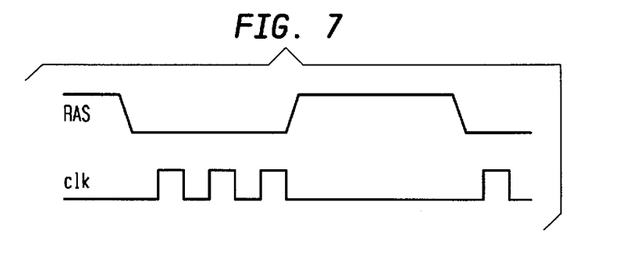
FIG. 7 illustrates timing signals to implement fuse latch refreshing with low power consumption.

By simple modification of the logic within logic blocks 58a' and 58b', it is possible to activate the clock signal (CLK) e.g., during each Row Address Strobe (RAS) low cycle. This is illustrated in the timing diagram of FIG. 7. At the falling edge of each RAS pulse, the clock signal can be activated for a certain number of pulses. The clock frequency can be adjusted to vary the number of clock pulses during each RAS low cycle. Power consumption can be freely traded off vs. the number of RAS cycles needed to refresh all the fuse latches. By way of example, a complete refresh of all the fuses can be realized after 32 RAS cycles. It is noted that fuse refresh need not be tied to RAS—it can alternatively be tied to each CAS cycle or be a continuous process over time as described above in connection with the ring shift registers.

With a further modification of TCL, it is also possible to refresh the fuse latches at an increased speed during a predetermined number, e.g., eight, of initial RAS only refresh (ROR) cycles after chip poweron. The fuse latches can alternatively be refreshed when suitable supply voltage (VCC) bump detection circuitry (not shown) has identified a VCC bump event.

While the above description contains many specifics, these specifics should not be construed as limitations on the scope of the invention, but merely as exemplifications of preferred embodiments thereof. For instance, while the embodiments have been described with particular reference to semiconductor memories employing fuses, memories that utilize fuse equivalents may also benefit from the present invention. Those skilled in the art will envision many other possible variations that are within the scope and spirit of the invention as defined by the claims appended hereto.

What is claimed is:

1. A semiconductor memory having a main memory cell array and redundant memory cells, said memory comprising:
    a plurality of fuses for storing address information, each fuse being in either an open or closed state corresponding to a bit of an address of at least one faulty cell within said main memory cell array;
    a plurality of latches for storing the address information stored in said fuses during operation of said semiconductor memory to facilitate storage of data in said redundant memory cells as a substitute for faulty cells in said main memory cell array; and
    serial transfer circuitry operable to serially transfer at least some of said address information from said fuses towards said latches.

2. The semiconductor memory of claim 1 wherein said semiconductor memory is a dynamic random access memory (DRAM).

3. The semiconductor memory of claim 1 wherein said semiconductor memory is packaged using leadframe on chip (LOC) packaging, and further wherein a continuous LOC tape extends across said memory.

4. The semiconductor memory of claim 3, comprising at least first and second main memory cell arrays, said latches being disposed between said first and second memory cell arrays, said fuses being disposed in a region of said semiconductor memory spaced from said latches, and said LOC tape extending continuously from said first memory cell array across said latches to said second memory cell array.

5. The semiconductor memory of claim 1 wherein a plurality n of bus lines is employed to transfer data in parallel between said fuses and said latches, where n is much smaller than the number of fuses.

6. The semiconductor memory of claim 5, wherein n is in the range of four to ten.

7. The semiconductor memory of claim 1, wherein said serial transfer circuitry includes a first shift register adjacent the fuses, a second shift register adjacent the latches, and timing and control logic coupled to each shift register to synchronize the transfer of said address information from said fuses into corresponding latches.

8. The semiconductor memory of claim 7, further including:
    a plurality of switches coupled between said fuses and at least one bus line, said switches being sequentially closed by said first register to serially transfer fuse data onto said bus line; and
    said plurality of latches being coupled to said at least one bus line, said second shift register sequentially activating latch set inputs of said latches to sequentially transfer said fuse data from said at least one bus line to said latches.

9. The semiconductor memory of claim 7, wherein said first and second shift registers are ring shift registers, thereby facilitating sequential refreshing of said latches.

10. The semiconductor memory of claim 1 wherein said fuses store addresses of columns of said main memory cell array that contain faulty cells.

11. The semiconductor memory of claim 1 wherein said fuses store addresses of rows of said main memory cell array that contain faulty cells.

12. The semiconductor memory of claim 1 wherein said main memory cell array and said redundant memory cells are each part of a common memory block, said redundant memory cells comprising particular columns and rows of said memory block.

13. The semiconductor memory of claim 12, further comprising fuse decoder circuitry disposed adjacent said memory block and said latches for enabling columns and rows of said redundant memory cells whenever an incoming address corresponds to an address stored by said fuses.

14. A random access memory (RAM) having a plurality of memory blocks, each memory block including a main memory cell array and redundant memory cells, said RAM comprising:
    a plurality of fuse banks each associated with one of said memory blocks and each including plural fuses for storing address information, each fuse being in either an open or closed state corresponding to a bit of an address of at least one faulty cell within said main memory cell array;
    a plurality of fuse latch sections, each including a plurality of fuse latches for storing the address information stored in one of said fuse banks during operation of said RAM to facilitate storage of data in said redundant memory cells as a substitute for faulty cells in said main memory cell array;
    at least one first shift register in proximity to said fuses of at least one of said fuse banks;
    at least one second shift register in proximity to at least one fuse latch section;
    a plurality of switches coupled between fuses of one of said fuse banks and at least one bus line, said switches being sequentially closed by said first shift register to serially transfer fuse data onto said bus line, said second shift register sequentially activating latch set inputs of said latches to sequentially transfer said fuse data from said at least one bus line to said latches; and
    logic circuitry coupled to said first and second registers to synchronize said registers to one another and control timing of fuse data transfer.

15. The random access memory of claim 14, wherein said random access memory comprises a dynamic random access memory (DRAM).

16. The random access memory of claim 14 wherein said at least one bus line comprises a plurality of n bus lines, where n is much smaller than the number of fuses in the associated fuse bank.

17. In a semiconductor memory having a main memory cell array, redundant memory cells for data storage in place of faulty cells of said main memory cell array, a plurality of fuses for storing address information indicative of a faulty cell or a group of cells containing a faulty cell, and a plurality of fuse latches for storing the address information of said fuses during operation of said semiconductor memory, a method for transferring the address information from said fuses to said latches, comprising:

provi ding at least one bus line between said plurality of fuses and said plurality of latches; and serially transferring at least some of said address information from said fuses towards said latches on said at least one bus line.

18. The method of claim 17 wherein said at least one bus line comprises a plurality n of bus lines, where n is much smaller than the number of said plurality of fuses, whereby fuse data of n fuses at a time are transferred to said latches.

19. The method of claim 17 further comprising the step of sequentially refreshing said fuse latches.

20. The method of claim 19, wherein said semiconductor memory is a dynamic random access memory, and said refreshing is synchronized with one of a RAS signal and a CAS signal.

21. The method of claim 19, wherein said refreshing is performed upon identification of a specific supply voltage bump event.

22. The method of claim 19, wherein said semiconductor memory is a dynamic random access memory and said refreshing is performed during a time associated with a predetermined number of RAS only refresh (ROR) cycles.

* * * * *